(12) United States Patent
Spenea et al.

(10) Patent No.: US 7,893,507 B2
(45) Date of Patent: Feb. 22, 2011

(54) METAL OXIDE SEMICONDUCTOR (MOS) TRANSISTORS WITH INCREASED BREAK DOWN VOLTAGES AND METHODS OF MAKING THE SAME

(75) Inventors: Marian Udrea Spenea, San Jose, CA (US); Serban Mihai Popescu, San Carlos, CA (US); Laszlo Lipcsei, Campbell, CA (US)

(73) Assignee: O2Micro International Limited, SMB, Georgetown (KY)

( * ) Notice: Subject to any disclaimer, the term of this patent is extended or adjusted under 35 U.S.C. 154(b) by 216 days.

(21) Appl. No.: 12/321,258

(22) Filed: Jan. 16, 2009

(65) Prior Publication Data

US 2009/0184380 A1     Jul. 23, 2009

Related U.S. Application Data

(60) Provisional application No. 61/011,940, filed on Jan. 23, 2008.

(51) Int. Cl.
    *H01L 29/02* (2006.01)
(52) U.S. Cl. .................. 257/402; 257/401; 257/409; 257/E29.255; 438/17; 438/163; 438/174
(58) Field of Classification Search ............. 257/401, 257/402, 409, E29.255; 438/17, 163, 174
    See application file for complete search history.

(56) References Cited

U.S. PATENT DOCUMENTS

| | | | |
|---|---|---|---|
| 4,153,904 A | 5/1979 | Tasch | 257/493 |
| 5,089,871 A | 2/1992 | Fujihara | 257/408 |
| 5,191,401 A | 3/1993 | Shirai | 257/328 |
| 5,646,054 A | 7/1997 | Rhee | 438/507 |
| 5,721,170 A | 2/1998 | Bergemont | 438/303 |
| 6,696,741 B1 | 2/2004 | Ronsisvalle | 257/487 |
| 6,828,609 B2 | 12/2004 | Deboy | 257/285 |
| 7,195,965 B2 | 3/2007 | Lin | 438/202 |

OTHER PUBLICATIONS

"Effect of Junction Curvature on Breakdown Voltage In Semiconductors", S. M. Sze and G. Gibbons, Solid-State Electronics, vol. 9, pp. 831-845, 1966 (16 Pages).

"The breakdown voltage of negative curvatured P+N diodes using a SOI layer" (Abstract), Dae-Seok Byeon, Min-Koo Han and Yearn-Ik Choi, , Solid-State Electronics, vol. 41, Issue 5, pp. 787-788, 1997 (4 Pages).

*Primary Examiner*—Tan N Tran

(57) ABSTRACT

A transistor comprises a substrate of a first conductivity type, a drain region and a source region of a second conductivity type, a gate, a gate oxide layer, an adjustment implant region of the first conductivity type and a planar junction. The drain region and the source region are disposed in the substrate. The gate is placed over the substrate between the source region and the drain region. The gate is separated from the substrate by the gate oxide layer. The adjustment implant region is disposed under the gate oxide layer and in the substrate. A second doping concentration of the adjustment implant region is higher than a first doping concentration of the substrate. The adjustment implant region and the drain region in a predetermined shape form the planar junction with a surface curvature pointing towards the drain region to relax electrical field intensity at a location of the planar junction.

22 Claims, 6 Drawing Sheets

METAL OXIDE SEMICONDUCTOR (MOS) TRANSISTORS WITH INCREASED BREAK DOWN VOLTAGES AND METHODS OF MAKING THE SAME

RELATED APPLICATION

This application claims priority to U.S. Provisional Application No. 61/011,940, filed on Jan. 23, 2008, which is hereby incorporated by reference in its entirety.

BACKGROUND

Some applications for semiconductor devices require metal-oxide semiconductor (MOS) transistors that can operate at relatively high voltages. A cross-section view of a high voltage MOS transistor (e.g., an NMOS transistor 100) is shown in FIG. 1. The NMOS transistor 100 can be fabricated in a P type substrate (P substrate) 102. In the P substrate 102, a heavily doped P+ implant region 104 (bulk), a heavily doped N+ source region 106 (source) and a lightly doped drain implant N well 108 (N– well) can be formed. In the N– well 108, a heavily doped N+ drain region 110 (drain) can be further formed. A gate oxide layer 112 is formed over the P substrate region between the source 106 and the drain 110. A gate 114 can be then formed over the gate oxide layer 112. Furthermore, to achieve a targeted threshold gate voltage, a doping concentration of the shallower P substrate region under the gate oxide layer 112 is higher than that of the P substrate region far away from the surface of the P substrate 102. Such heavily doped P substrate region under the gate oxide layer 112 is called an adjustment implant layer 116 (PA layer). The NMOS transistor 100 is realized in a layout structure composed by linear strips. As the lightly doped drain region (N– well 108) extends under the gate oxide layer 112, the N– well 108 intersects with the PA layer 116. As such, a linear planar PN junction 118 is formed between the N– well 108 and the PA layer 116.

As shown in FIG. 1, a distance from a location of the linear planar PN junction 118 to the center of the drain 110 is denoted as D. The linear planar PN junction 118 can be a curved junction rather than an ideal plane junction. As a result, a drain breakdown voltage of the NMOS transistor 100 is determined by an avalanche breakdown voltage of the linear planar PN junction 118. Therefore, due to a junction curvature effect of the curved junction, the avalanche breakdown voltage of linear planar PN junction 118 is decreased. Consequently, the drain breakdown voltage of the NMOS transistor 100 can be decreased.

As the drain breakdown voltage is regarded as one of the important design parameters of high voltage MOS transistors, various methods have been proposed so as to counterbalance the junction curvature effect. These methods include changing the thickness of the gate, changing the drain doping profile, and implementing multiple doping layers in the drain region. However, the above-mentioned methods may need supplementary processing steps and supplementary masks, which may increase costs of MOS transistors.

SUMMARY

Embodiments in accordance with the present invention provide MOS transistors with increased breakdown voltages and methods of making the same. In one embodiment, a transistor comprises a substrate of a first conductivity type, a drain region and a source region of a second conductivity type, a gate, a gate oxide layer, an adjustment implant region of the first conductivity type and a planar junction. The drain region and the source region are disposed in the substrate. The gate is placed over the substrate between the source region and the drain region. The gate is separated from the substrate by the gate oxide layer. The adjustment implant region is disposed under the gate oxide layer and in the substrate. A second doping concentration of the adjustment implant region is higher than a first doping concentration of the substrate. The adjustment implant region and the drain region in a predetermined shape form the planar junction with a surface curvature pointing towards the drain region to relax electrical field intensity at a location of the planar junction.

BRIEF DESCRIPTION OF THE DRAWINGS

Advantages of the present invention will be apparent from the following detailed description of exemplary embodiments thereof, which description should be considered in conjunction with the accompanying drawings, in which.

DETAILED DESCRIPTION

Reference will now be made in detail to embodiments of the present invention. While the invention will be described in conjunction with the embodiments, it will be understood that they are not intended to limit the invention to these embodiments. On the contrary, the invention is intended to cover alternatives, modifications and equivalents, which may be included within the spirit and scope of the invention as defined by the appended claims.

In one embodiment, the present invention provides a MOS transistor with an increased drain breakdown voltage, allowing the MOS transistor to operate at relatively high voltages. In one such embodiment, the MOS transistor can be laid out in a predetermined shape (e.g. a circular shape) which can counterbalance the junction curvature effect. As a result, the drain breakdown voltage of the MOS transistor can be increased without using supplementary processing steps and masks.

Figure 2:
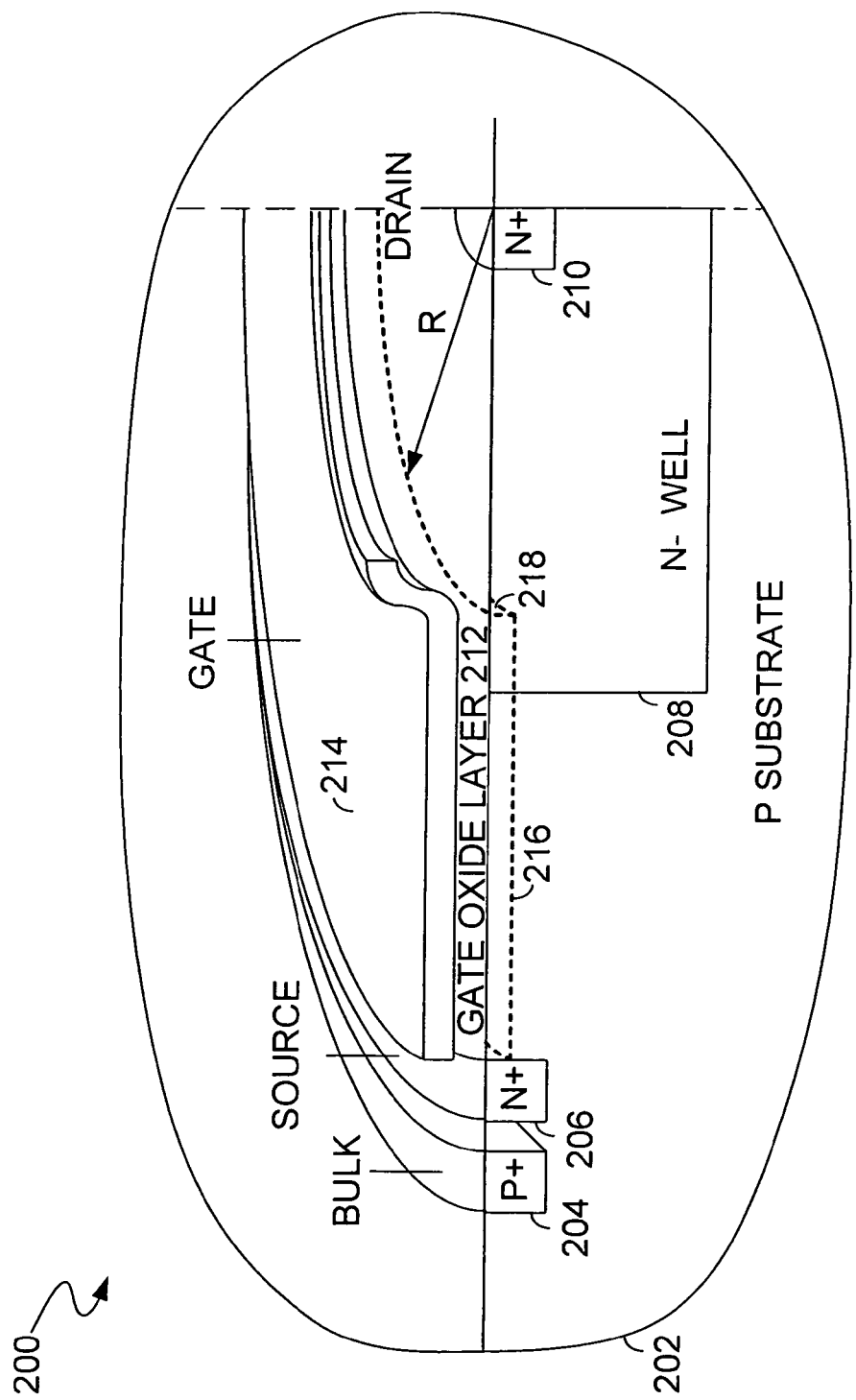
FIG. 2 is a perspective view of a MOS transistor according to one embodiment of the present invention.

FIG. 2 illustrates a perspective view of the left half of a MOS transistor 200 according to one embodiment of the present invention. The MOS transistor 200 can be fabricated in a substrate of a first conductivity type (e.g., P substrate 202). In the P substrate 202, a heavily doped P+ implant region 204 (bulk) and a heavily doped source of a second conductivity type (e.g., a heavily doped N+ source region 206) can be formed. In one embodiment, a lightly doped circular drain implant N well 208 (N– well) can be formed in the P substrate 202. In the circular N– well 208, a heavily doped circular N+ drain region 210 (drain) can be further formed. A circular gate oxide layer 212 is formed over the P substrate region between the source 206 and the circular drain 210. A circular gate 214 can be then formed over the circular gate oxide layer 212. P substrate region under the circular gate oxide layer 212, which has a doping concentration higher than that of the P substrate region far away from the surface of the P substrate 202, forms a circular adjustment implant layer 216 (PA layer). As such, the MOS transistor 200 is realized in a layout structure composed by concentric circular bands centered on the central circular drain region, in one embodiment. As the lightly doped circular drain region (circular N– well 208) extends under the circular gate oxide layer 212, the circular N– well 208 intersects with the circular PA layer 216. As such, a circular planar PN junction 218 is formed between the circular N– well 208 and the circular PA layer 216, with a surface curvature of the circular planar PN junction 218 pointing towards the lightly doped circular drain region (circular N– well 208), in one embodiment.

Figure 1:
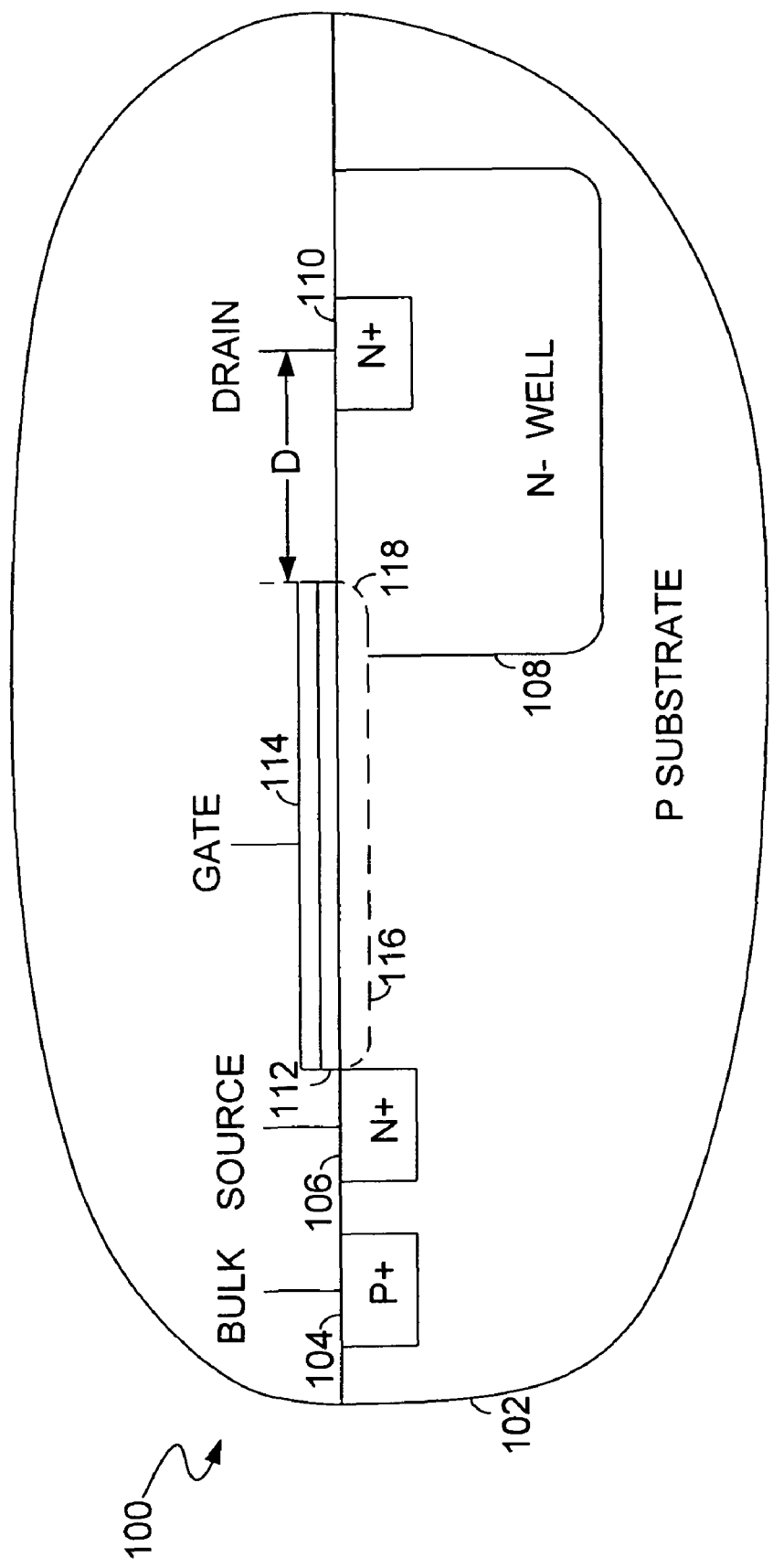
FIG. 1 is a cross-section view of a conventional MOS transistor.

As shown in FIG. 2, the circular planar PN junction 218 can have a radius of R, the distance from a location of the circular planar PN junction 218 to the center of the circular drain 210. In one embodiment, the radius R is comparable to an extension of a space charge region of the reverse biased circular planar PN junction 218. Due to the circular layout structure of the MOS transistor 200, electrical field distribution at the lightly doped circular drain region side of the reverse biased circular planar PN junction 218 is changed compared to that of the linear planar PN junction 118 in FIG. 1. In this instance, lines of electrical forces between the circular drain 210 and the circular gate 214 come out from the surface of the circular drain 210 and go along the radial direction to the circular gate 214. A peak of the electrical field at the lightly doped circular drain region side of the circular planar PN junction 218 is at a distance from the location of the circular planar PN junction 218, rather than exactly at the location of the circular planar PN junction 218, in one embodiment. Moreover, the distance between the location of the circular planar PN junction 218 and the peak of the electrical field at the lightly doped circular drain region increases with increase of the drain voltage. Furthermore, lines of electrical forces can spread at the location of the circular planar PN junction 218 such that the electrical field intensity at the location of the circular planar PN junction 218 can be relaxed.

Advantageously, the relaxation of the electrical field intensity at the location of the circular planar PN junction 218 can counterbalance the above-mentioned junction curvature effect of the circular planar PN junction 218, which is also a curved junction. In other words, the curvature effect of the circular planar PN junction 218 can be compensated by the electrical field distribution change at the lightly doped circular drain region side and the resultant relaxation of the electrical field intensity at the location of the circular planar PN junction 218 caused by the surface curvature of the circular planar PN junction 218 pointing towards the lightly doped circular drain region. As such, the avalanche breakdown voltage of the circular planar PN junction 218 can be increased by the compensation effect, and the drain breakdown voltage of the MOS transistor 200 can in turn be increased. Furthermore, fabrication of the MOS transistor 200 involves no supplementary processing steps and supplementary masks, which can avoid cost increase associated with fabrication of MOS transistors.

Advantageously, in one embodiment, the circular gate oxide layer 212 can be fabricated thin enough to achieve a relatively high transconductance between the circular drain 210 and the source 206. Furthermore, the electrical field intensity applied to the circular gate oxide layer 212 at the drain to gate frontier of the circular planar PN junction 218 can be relaxed, such that hot carriers (holes and electrons) are not accelerated to a speed which can cause hot carrier injection effect in the circular gate oxide layer 212. Hot carrier injection effect can degrade the performance of a MOS transistor. As such, MOS transistors with thin gate oxide in accordance with embodiments of the present invention can further prevent/reduce the hot carrier injection effect with the advantage of the relatively high transconductance between the drain and the source.

In one embodiment, the P substrate 202 can be a silicon substrate doped by P type impurity atoms such as Boron (B). However, the P substrate 202 can also be other semiconductor substrates such as a germanium (Ge) substrate, a silicon germanium (SiGe) substrate, a silicon carbide substrate, a gallium arsenide substrate or the like. Similarly, N type impurity atoms of the source 206 can include phosphorus atoms, arsenic atoms or the like. The circular gate 214 can be deposited by metal, polysilicon or other conductive materials. In addition, PMOS transistors may also be made in accordance with the principles of the present invention by providing substrate, bulk, source, PA layer and drain regions of the opposite doping type shown in FIG. 2.

Alternatively, the MOS transistors that can operate at relatively high voltages in accordance with embodiments of the present invention can be layout in other predetermined shapes, as long as the planar junction with the surface curvature pointing towards the lightly doped drain region can be formed to relax the electrical field intensity at the location of the planar junction.

Figure 3:
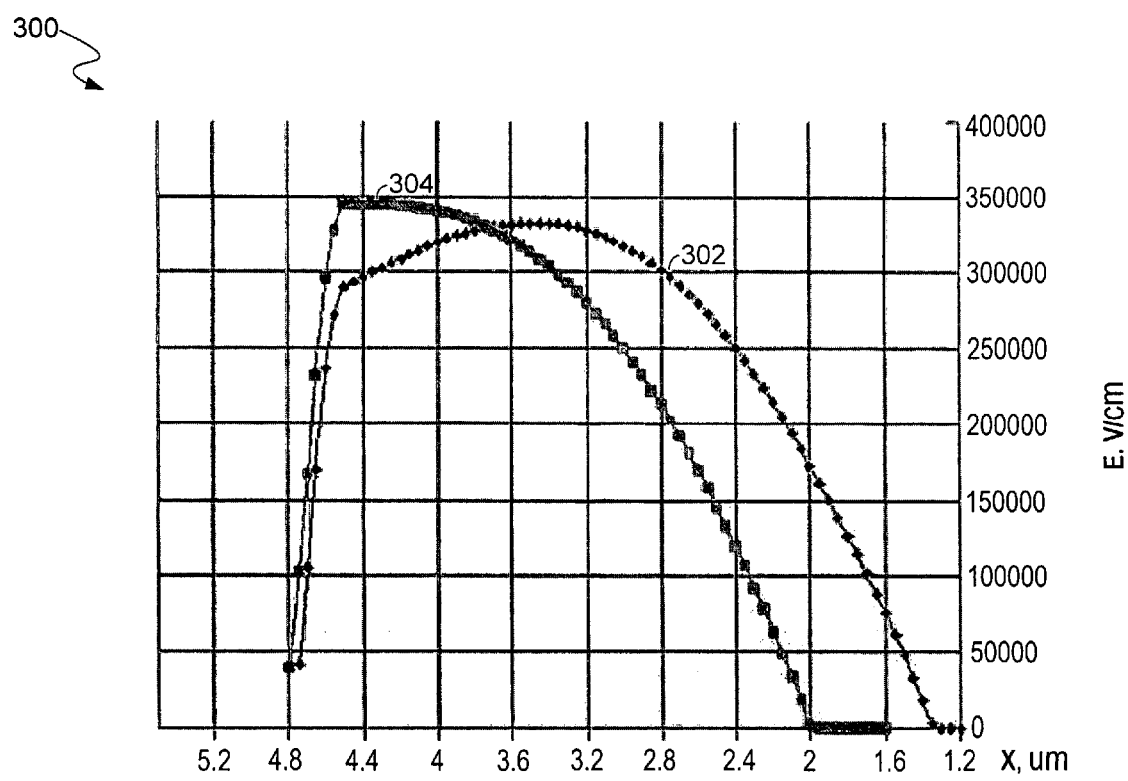
FIG. 3 is a plot representing electrical field distributions of a prior art MOS transistor and a MOS transistor according to one embodiment of the present invention.

FIG. 3 illustrates a plot 300 representing electrical field distributions of both of the NMOS transistor 100 and the circular MOS transistor 200, according to one embodiment of the present invention. FIG. 3 is described in combination with FIG. 1 and FIG. 2. The electrical field distributions of the NMOS transistors 100 and 200 relate to parameters such as D, R and the gate voltage. Thus, in calculation of the electrical field distributions of the NMOS transistors 100 and 200, parameters D (the distance between the location of the linear planar PN junction 118 and the center of the drain 110) and R (the distance between the location of the circular planar PN junction 218 and the center of the circular drain 210) are assumed to be equal to 4.5 micrometers (um). Furthermore, the gate 114 and the circular gate 214 are assumed to be respectively coupled to ground. As shown in FIG. 3, the coordinates of the center of the drain 110 (or the circular drain 210) is defined as (0, 0), the X-coordinate represents the distance from the center of the drain 110 (or the circular drain 210), and the Y-coordinate represents the electrical field intensity at the lightly doped drain region side of the linear planar PN junction 118 (or the circular planar PN junction 218). Curve 302 represents the electrical field distribution of the circular MOS transistor 200 and curve 304 represents the electrical filed distribution of the NMOS transistor 100.

As can be seen from curve 302, the peak of the electrical field of the circular MOS transistor 200 is at about 3.4 um from the circular drain 210. As can be seen from curve 304, the peak of the electrical field of the NMOS transistor 100 is at about 4.5 um from the drain 110, which is exactly at the location of the linear planar PN junction 118. Thus, FIG. 3 shows that for the circular MOS transistor 200, the electrical filed intensity at the location of the circular planar PN junction 218 is relaxed. Furthermore, avalanche breakdown voltages of both of the linear planar PN junction 118 and the circular planar PN junction 218 can be calculated. In one embodiment, avalanche breakdown voltages of the circular planar PN junction 218 and the linear planar PN junction 118 can be respectively 84.6 volts and 68.3 volts. The avalanche breakdown voltage of the circular planar PN junction 218 is about 24% higher than that of the linear planar PN junction 118, in one embodiment.

Figure 4:
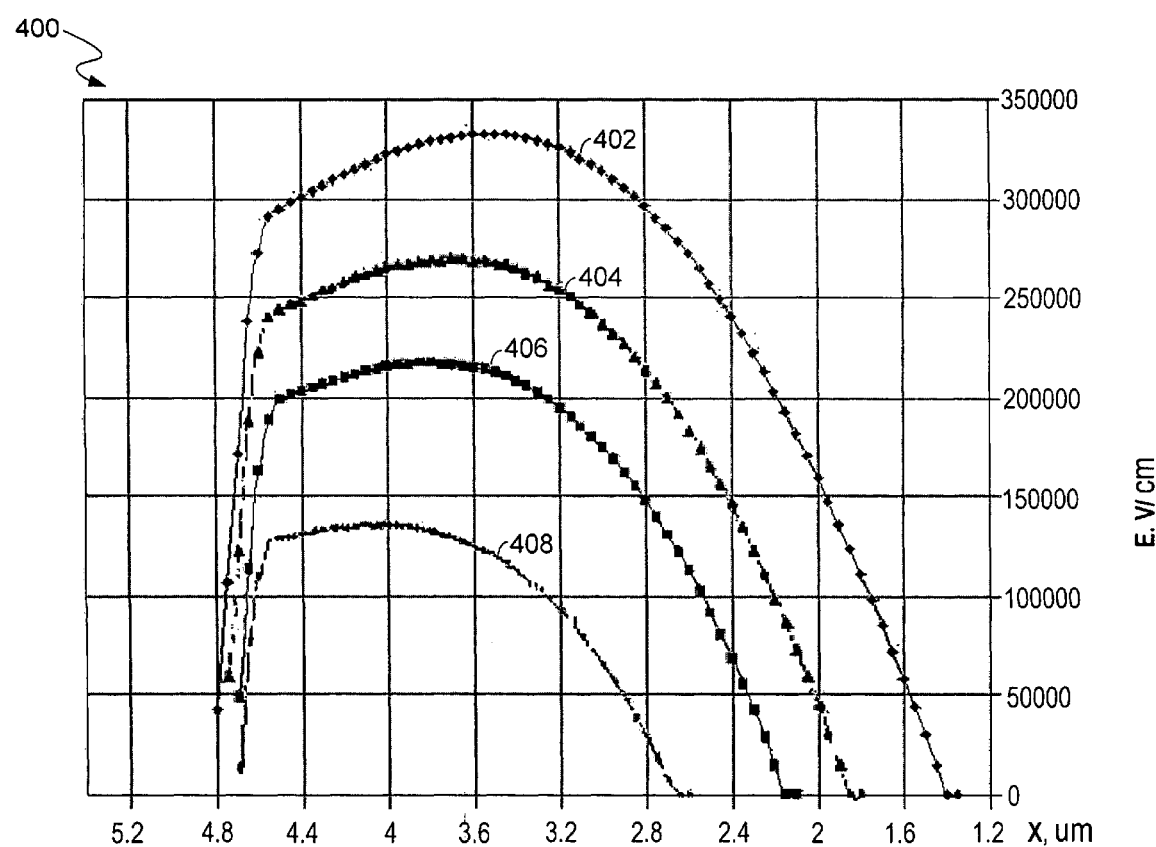
FIG. 4 is a plot representing electrical field distributions of a MOS transistor under different drain voltages according to one embodiment of the present invention.

FIG. 4 illustrates a plot 400 representing electrical field distributions of the circular MOS transistor 200 under different drain voltages, according to one embodiment of the present invention. FIG. 4 is described in combination with FIG. 2. In calculation of the electrical field distributions, the radius R of the circular planar PN junction 218 is assumed to be 4.5 um and the gate voltage of the circular MOS transistor 200 is assumed to be 0 volts. As shown in FIG. 4, the coordinates of the center of the circular drain 210 is defined as (0, 0), the X-coordinate represents the distance from the center of the circular drain 210, and the Y-coordinate represents the electrical field intensity at the lightly doped drain region side of the circular planar PN junction 218. Curves 402, 404, 406 and 408 represent electrical field distributions of the circular MOS transistor 200 under drain voltages of 84.6 volts, 59.8 volts, 42.6 volts and 21.0 volts, respectively.

As can be seen from curves 402, 404, 406 and 408, peaks of the electrical field are shifted from the location of the circular planar PN junction 218 towards the center of the circular drain region 210 as the drain voltage increases. Thus, the electrical field intensity at the location of the circular planar PN junction 218 is relaxed as the drain voltage increases. Also, the circular gate oxide layer 212 will be subjected to a less intense electrical field at the drain-to-gate frontier and therefore the hot carrier injection effect in the circular gate oxide layer 212 can be prevented/reduced. Moreover, as illustrated by curves 402, 404, 406 and 408, the distance between the location of the circular planar PN junction 218 and the peak of electrical field is 1 um when the drain voltage is 84.6 volts, 0.8 um when the drain voltage is 59.8 volts, 0.7 um when the drain voltage is 42.6 volts, and 0.45 um when the drain voltage is 21.0 volts. As such, the larger the drain voltage, the larger the distance between the location of the circular planar PN junction 218 and the peak of electrical field will be, in one embodiment.

Figure 5:
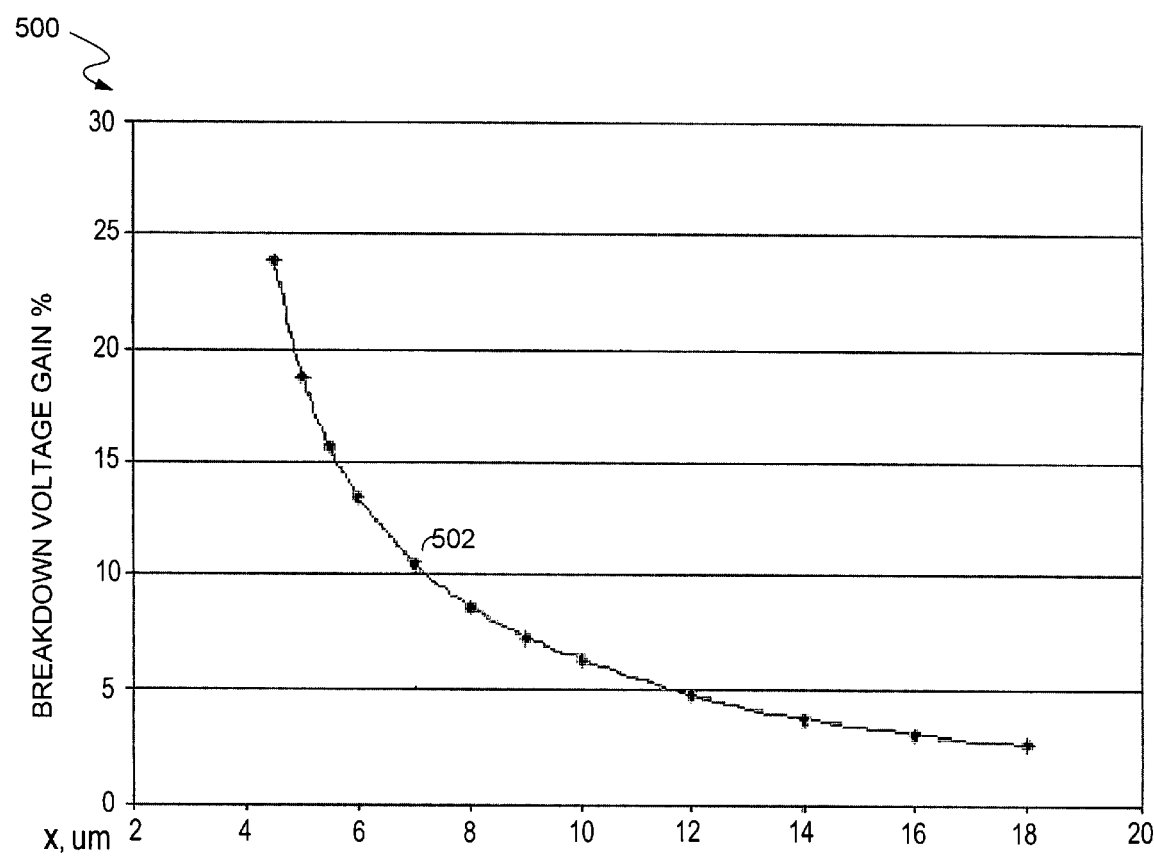
FIG. 5 is a plot representing a drain breakdown voltage gain by comparing the breakdown voltages of an exemplary MOS transistor and a conventional MOS transistor.

FIG. 5 illustrates a plot 500 representing the drain breakdown voltage gain by comparing the breakdown voltages of the circular MOS transistor 200 and the NMOS transistor 100, according to one embodiment of the present invention. FIG. 5 is described in combination with FIG. 1 and FIG. 2. In calculation of the breakdown voltage gain, the space charge region extensions of both the circular MOS transistor 200 and the high voltage NMOS transistor 100 are assumed to be 3.4 um. As shown in FIG. 5, X-coordinate represents the radius R of the circular planar PN junction 218, and Y-coordinate represents the breakdown voltage gain. Curve 502 represents the breakdown voltage gain of the circular MOS transistor 200 versus the high voltage NMOS transistor 100.

As can be seen from curve 502, the smaller the radius R, the higher the breakdown voltage gain is. The breakdown voltage gain becomes negligible (e.g., less than 5%) when the radius R is larger than 12 micrometers, in one embodiment. Thus, according to curve 502, the radius R can be maintained less than 7 um (twice of the extension of the space charge region) so as to get a desirable breakdown voltage gain (e.g., more than 10%), in one embodiment.

Figure 6:
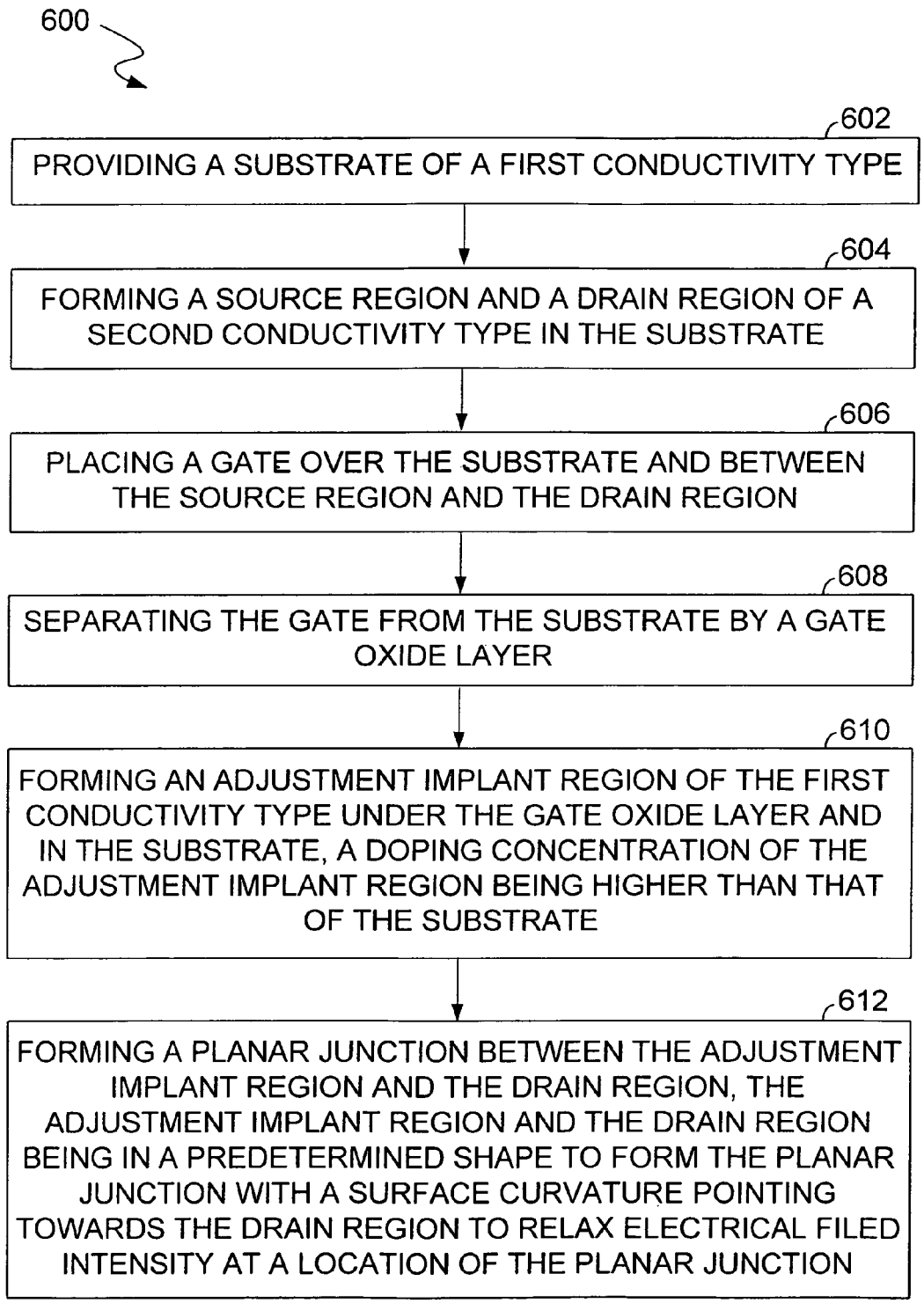
FIG. 6 is a flow chart of a method of fabricating a MOS transistor according to one embodiment of the present invention.

FIG. 6 illustrates a flow chart 600 of a method of fabricating a MOS transistor according to one embodiment of the present invention. FIG. 6 is described in combination with FIG. 2. Although specific steps are disclosed in FIG. 6, such steps are exemplary. That is, the present invention is well suited to performing various other steps or variations of the steps recited in FIG. 6.

In block 602, a substrate of a first conductivity type is provided. In one embodiment, the P substrate 202 is provided for fabricating the MOS transistor 200.

In block 604, a source region and a drain region of a second conductivity type is formed in the substrate. In one embodiment, the heavily doped N+ source region 206 is formed in the P substrate 202. Furthermore, the drain region including the lightly doped circular drain implant N well 208 and the heavily doped circular N+ drain region 210 is formed in the P substrate 202.

In block 606, a gate is placed over the substrate between the source region and the drain region. In one embodiment, the circular gate 214 is placed over the P substrate 202 between the source 206 and the circular drain 210.

In block 608, the gate is separated from the substrate by a gate oxide layer. In one embodiment, the circular gate 214 is separated from the P substrate 202 by the circular gate oxide layer 212.

In block 610, an adjustment implant region of the first conductivity type, which has a doping concentration higher than that of the substrate, is formed under the gate oxide layer and in the substrate. In one embodiment, the circular PA layer 216, which has a doping concentration higher than that of the P substrate region far away from the surface of the P substrate 202, is formed under the circular gate oxide layer 212 and in the P substrate 202.

In block 612, the adjustment implant region and the drain region in a predetermined shape forms a planar junction therebetween with a surface curvature pointing towards the drain region to relax electrical field intensity at a location of the planar junction. In one embodiment, as the lightly doped drain region in the circular shape (circular N– well 208) intersects the PA layer 216 in the circular shape, the circular planar PN junction 218 is formed between the circular N– well 208 and the circular PA layer 216, with the surface curvature of the circular planar PN junction 218 pointing towards the circular N– well 208. The electrical field intensity at the location of the circular planar PN junction 218 is therefore relaxed.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

What is claimed is:

1. A transistor comprising:
    a substrate of a first conductivity type and having a first doping concentration;
    a drain region and a source region of a second conductivity type and disposed in said substrate;
    a gate separated from said substrate by a gate oxide layer and placed between said source region and said drain region;
    an adjustment implant region of said first conductivity type and disposed under said gate oxide layer and in said substrate, said adjustment implant region having a second doping concentration higher than said first doping concentration; and
    a planar junction formed between said adjustment implant region and said drain region, said adjustment implant region and said drain region being in a predetermined shape to form said planar junction with a surface curvature pointing towards said drain region to relax electrical field intensity at a location of said planar junction.

2. The transistor of claim 1, wherein said drain region comprises a first well region and a second drain region disposed in said first well region, and wherein said first well region has a lighter doping concentration than said second drain region.

3. The transistor of claim 1, further comprising:
a bulk region of said first conductivity type disposed in said substrate.

4. The transistor of claim 1, wherein said predetermined shape is a substantially circular shape.

5. The transistor of claim 1, wherein said gate and said gate oxide layer are substantially circular in shape.

6. The transistor of claim 1, wherein said planar junction is substantially circular in shape.

7. The transistor of claim 1, wherein a thickness of said gate oxide layer is determined by a transconductance between said drain region and said source region.

8. The transistor of claim 1, wherein a peak of an electrical field at said drain region side of said planar junction is at a distance from said location of said planar junction.

9. The transistor of claim 8, wherein said distance between said peak of said electrical field and said location of said planar junction is determined by a drain voltage applied to said drain region.

10. The transistor of claim 1, wherein a breakdown voltage gain associated with said transistor is determined by a radius of said planar junction.

11. The transistor of claim 10, wherein said radius of said planar junction is no more than twice of an extension of a space charge region of said planar junction.

12. A method for fabricating a transistor, comprising:
providing a substrate of a first conductivity type and having a first doping concentration;
forming a source region and a drain region of a second conductivity type in said substrate;
placing a gate over said substrate and between said source region and said drain region;
separating said gate from said substrate by a gate oxide layer;
forming an adjustment implant region under said gate oxide layer and in said substrate, said adjustment implant region being of said first conductivity type and having a second doping concentration higher than said first doping concentration; and
forming a planar junction between said adjustment implant region and said drain region, said adjustment implant region and said drain region being in a predetermined shape to form said planar junction with a surface curvature pointing towards said drain region to relax electrical field intensity at a location of said planar junction.

13. The method of claim 12, further comprising:
forming a first well region in said drain region; and
forming a second drain region in said first well region, wherein said first well region has a lighter doping concentration than said second drain region.

14. The method of claim 12, further comprising:
forming a bulk region of said first conductivity type in said substrate.

15. The method of claim 12, wherein said predetermined shape is a substantially circular shape.

16. The method of claim 12, wherein said gate and said gate oxide layer are substantially circular in shape.

17. The method of claim 12, wherein said planar junction is substantially circular in shape.

18. The method of claim 12, further comprising:
determining a thickness of said gate oxide layer by a transconductance between said drain region and said source region.

19. The method of claim 12, wherein a peak of an electrical field at said drain region side of said planar junction is at a distance from said location of said planar junction.

20. The method of claim 19, further comprising:
determining said distance between said peak of said electrical field and said location of said planar junction by a drain voltage applied to said drain region.

21. The method of claim 12, further comprising:
determining a breakdown voltage gain associated with said transistor by a radius of said planar junction.

22. The method of claim 21, wherein said radius of said planar junction is no more than twice of an extension of a space charge region of said planar junction.

* * * * *